(12) United States Patent
Mizutani et al.

(10) Patent No.: US 8,455,577 B2
(45) Date of Patent: Jun. 4, 2013

(54) PHOTOSENSITIVE RESIN COMPOSITION, FLEXIBLE CIRCUIT BOARD EMPLOYING THE SAME, AND CIRCUIT BOARD PRODUCTION METHOD

(75) Inventors: Masaki Mizutani, Ibaraki (JP); Toshikazu Baba, Ibaraki (JP); Yoshihiro Kawamura, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 305 days.

(21) Appl. No.: 12/849,896

(22) Filed: Aug. 4, 2010

(65) Prior Publication Data
US 2011/0030998 A1 Feb. 10, 2011

(30) Foreign Application Priority Data
Aug. 7, 2009 (JP) .................. 2009-184873

(51) Int. Cl.
*C08K 5/5399* (2006.01)
(52) U.S. Cl.
USPC ........................................ 524/138; 430/315
(58) Field of Classification Search
USPC ........................................ 524/138; 430/315
See application file for complete search history.

(56) References Cited

U.S. PATENT DOCUMENTS

| | | | |
|---|---|---|---|
| 7,247,659 B2 | 7/2007 | Kura et al. | |
| 7,910,631 B2 * | 3/2011 | Fujii et al. | 522/171 |
| 8,026,045 B2 * | 9/2011 | Mizutani et al. | 430/319 |
| 2005/0037207 A1 | 2/2005 | Komiyama | |
| 2008/0063955 A1 | 3/2008 | Fujii et al. | |
| 2008/0097000 A1 | 4/2008 | Fujii et al. | |
| 2008/0241759 A1 * | 10/2008 | Mizutani et al. | 430/315 |
| 2009/0101394 A1 * | 4/2009 | Fujii et al. | 174/254 |
| 2010/0270060 A1 | 10/2010 | Mizutani et al. | |
| 2011/0030998 A1 | 2/2011 | Mizutani et al. | |

FOREIGN PATENT DOCUMENTS

| | | |
|---|---|---|
| CN | 101377621 A | 3/2009 |
| JP | 2006-235371 A | 9/2006 |
| JP | 2006-301186 A | 11/2006 |
| JP | 2007-328049 A | 12/2007 |
| JP | 2008-083683 A | 4/2008 |
| JP | 2008-083684 A | 10/2008 |
| JP | 2009-098456 A | 5/2009 |
| JP | 2010-256718 A | 11/2010 |

OTHER PUBLICATIONS

Chinese Office Action dated May 28, 2012, issued in corresponding Chinese Patent Application No. 201010249050.5, (12 pages). With English Translation.
Chinese Office Action dated Jun. 11, 2012, issued in corresponding Chinese Patent Application No. 201010159118.0, (12 pages). With English Translation (Co-Pending U.S. Appl. No. 12/766,352).
Japanese Office Action dated Jan. 29, 2013, issued in corresponding Japanese Patent Application No. 2009-108237, with English translation (8 pages).
Japanese Office Action dated Jan. 29, 2013, issued in corresponding Japanese Patent Application No. 2009-184873, with English translation (8 pages).
U.S. Office Action dated Feb. 14, 2013, issued in corresponding U.S. Appl. No. 12/766,352.
U.S. Office Action dated Aug. 29, 2012, issued in corresponding U.S. Appl. No. 12/766,352.

\* cited by examiner

*Primary Examiner* — Peter Szekely
(74) *Attorney, Agent, or Firm* — Westerman, Hattori, Daniels & Adrian, LLP

(57) ABSTRACT

A halogen-free and flame-resistant photosensitive resin composition is provided, which has properties necessary for a solder resist (insulative property, solder heat resistance, alkali developability and the like) and is capable of forming a film that is excellent in folding endurance even after an IR reflow process. A flexible circuit board employing the photosensitive resin composition and a circuit board production method are also provided. The photosensitive resin composition comprises: (A) a linear polymer of an ethylenically unsaturated compound comprising a carboxyl-containing ethylenically unsaturated compound; (B) an epoxy resin; (C) a polymerizable compound containing an ethylenically unsaturated group; (D) a photopolymerization initiator; and a cyclic phosphazene (E) represented by the following general formula (1):

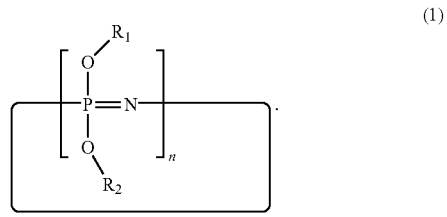

(1)

18 Claims, 1 Drawing Sheet

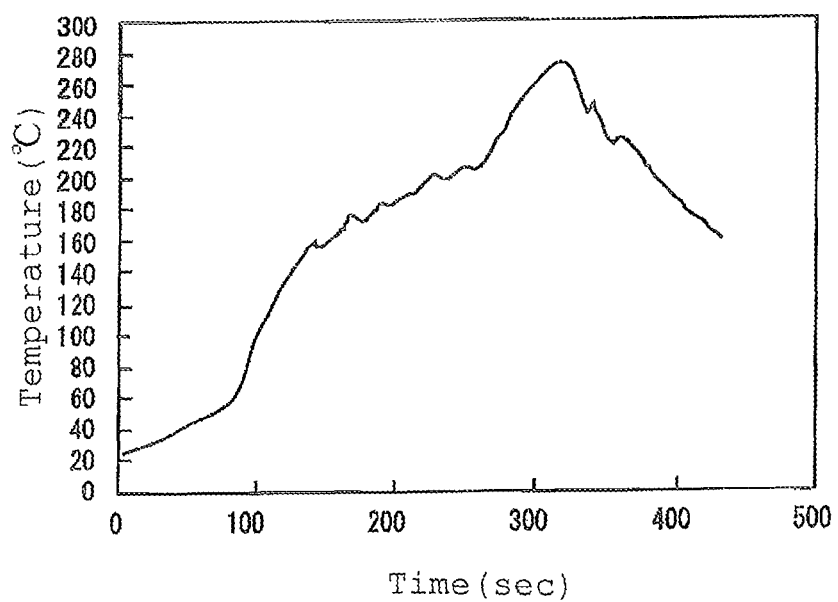

PHOTOSENSITIVE RESIN COMPOSITION, FLEXIBLE CIRCUIT BOARD EMPLOYING THE SAME, AND CIRCUIT BOARD PRODUCTION METHOD

BACKGROUND OF THE INVENTION

1. Field of the Invention

The present invention relates to a photosensitive resin composition, a flexible circuit board employing the photosensitive resin composition, and a circuit board production method.

2. Description of the Related Art

A flexible circuit board on which an electronic component such as a semiconductor element is mounted by soldering generally includes a surface protective layer (cover insulating layer) provided on a conductive pattern formation surface of a wiring circuit board thereof. The surface protective layer is typically formed by stamping a polyimide film formed with an adhesive layer (so-called cover lay film) into a predetermined shape and bonding the film on the conductive pattern formation surface. Where the cover insulating layer is formed as having a fine opening pattern (conformal to openings provided in the board), the formation of the cover insulating layer is achieved by forming a film of a heat-resistant material called "solder resist" on a necessary portion of the conductive pattern formation surface and curing the solder resist film by a screen printing method and an exposure/development method. The cover insulating layer is required to have an insulative property and solder heat resistance during the soldering of the electronic component.

The flexible circuit board is incorporated in an electronic device such as a mobile phone after the mounting of the electronic component. The flexible circuit board is often folded so as to be properly accommodated in a narrow space in the electronic device. In this case, the cover lay film, which is excellent in folding endurance, is selected as a cover insulating layer to be provided in a foldable portion of the board. However, the solder resist film, which is poorer in folding endurance, is rarely selected.

Thus, the cover lay film and the solder resist are selectively used for forming parts of the cover insulating layer of the flexible circuit board according to necessary properties such as the folding endurance and the fineness of the opening pattern. Therefore, it is a common practice to use the cover lay film and the solder resist in combination.

However, the combinational use of the cover lay film and the solder resist increases the number of steps of the production process, making it difficult to reduce production costs.

To solve this problem, the applicant of the present invention has previously proposes several photosensitive resin compositions excellent in flexibility and suitable for use as a solder resist (see JP-A-2006-235371, JP-A-2006-301186 and JP-2008-83683).

However, the photosensitive resin compositions disclosed in JP-A-2006-235371, JP-A-2006-301186 and JP-2008-83683 each have a lower thermal decomposition temperature and, hence, are unsatisfactory in folding endurance after an IR reflow process (in which a solder is reflowed by far infrared radiation). Therefore, there is still room for improvement in this respect.

With a recent trend toward environmental protection, there is a demand for a halogen-free flame-resistant photosensitive resin composition. To meet the demand, a photosensitive resin composition disclosed in JP-A-2008-83683, for example, contains a phosphorus-containing flame retarder component instead of a bromine-containing flame retarder component. However, the phosphorus-containing flame retarder component is liable to be deposited in a higher-temperature higher-humidity environment. It is desirable to solve this problem.

In view of the foregoing, it is an object of the present invention to provide a halogen-free and flame-resistant photosensitive resin composition which has properties necessary for the solder resist (insulative property, solder heat resistance, alkali developability and the like) and is capable of forming a film that is excellent in folding endurance even after the IR reflow process, and to provide a flexible circuit board employing the photosensitive resin composition and a circuit board production method.

SUMMARY OF THE INVENTION

According to a first aspect of the present invention, there is provided a photosensitive resin composition comprising: (A) a linear polymer of an ethylenically unsaturated compound comprising a carboxyl-containing ethylenically unsaturated compound; (B) an epoxy resin; (C) a polymerizable compound containing an ethylenically unsaturated group; (D) a photopolymerization initiator; and (E) a cyclic phosphazene represented by the following general formula (1):

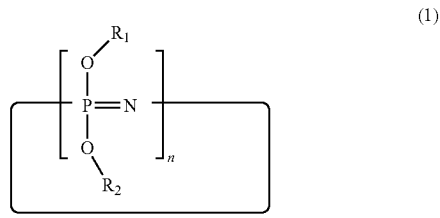

wherein $R_1$ and $R_2$, which may be the same or different, are each a $C_1$ to $C_{18}$ alkyl group,

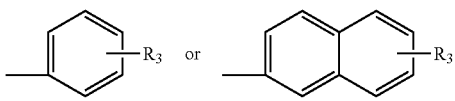

(wherein $R_3$ is a hydrogen atom, a cyano group, a $C_1$ to $C_{10}$ alkyl group, an allyl group, a phenyl group or a hydroxyl group), and n is an integer of 3 to 25, the photosensitive resin composition having a tensile breaking elongation percentage of not less than 10% and a 2% weight loss temperature of not lower than 260° C. after being cured.

According to a second aspect of the present invention, there is provided a flexible circuit board including a cover insulating layer which is provided on a surface of a wiring circuit board formed with an electrically conductive circuit pattern and is formed from the aforementioned photosensitive resin composition.

According to a third aspect of the present invention, there is provided a flexible circuit board production method, which includes the step of forming a cover insulating layer on a surface of a wiring circuit board formed with an electrically conductive circuit pattern by forming a layer of the aforementioned photosensitive resin composition on the surface of the wiring circuit board, exposing the photosensitive resin composition layer in a predetermined pattern, and developing the exposed photosensitive resin composition layer.

The inventors of the present invention conducted a series of studies to solve the aforementioned problem. The inventors prepared the photosensitive resin composition by employing the linear polymer (A), the epoxy resin (B), the polymerizable compound (C) containing the ethylenically unsaturated group and the predetermined flame retarder (E) in combination and determining the proportions of these components so that the photosensitive resin composition has a tensile breaking elongation percentage of not less than 10% and a 2% weight loss temperature of not lower than 260° C. after being cured by photopolymerization. As a result, the inventors found that the photosensitive resin composition has properties generally necessary for the solder resist (insulative property, solder heat resistance and alkali developability) and, like the cover lay film, a film formed by curing the photosensitive resin composition is excellent in flexibility and in folding endurance even after the IR reflow process. The excellent folding endurance even after the IR reflow process is supposedly attributable to the higher tensile breaking elongation percentage, which makes the cured photosensitive resin composition less susceptible to cracking which may otherwise occur due to a stress applied during a folding test. The excellent folding endurance is also attributable to the higher 2% weight loss temperature, which makes the cured photosensitive resin composition less susceptible to thermal degradation even after the IR reflow process. In the present invention, the specific cyclic phosphazene (E) represented by the above general formula (1) is contained as a flame retarder in the photosensitive resin composition, so that the photosensitive resin composition is halogen-free and flame-resistant. The photosensitive resin composition containing the cyclic phosphazene is generally excellent in flame resistance, but is liable to suffer from deposition of the cyclic phosphazene in a higher-temperature higher-humidity environment. However, the inventive photosensitive resin composition has a feature such that the deposition of the cyclic phosphazene in the higher-temperature higher-humidity environment can be suppressed by properly determining the proportions of the respective components of the photosensitive resin composition. Therefore, a halogen-free flame-resistant flexible circuit board can be produced as having a surface protective layer (cover insulating layer) excellent in folding endurance even after the IR reflow process by forming a solder resist film from the photosensitive resin composition on the surface thereof formed with an electrically conductive circuit pattern.

As described above, the inventive photosensitive resin composition contains the linear polymer (A), the epoxy resin (B), the polymerizable compound (C) containing the ethylenically unsaturated group and the specific cyclic phosphazene (E), and has a tensile breaking elongation percentage of not less than 10% and a 2% weight loss temperature of not lower than 260° C. after being cured. Therefore, the cured photosensitive resin composition has insulative property, solder heat resistance, alkali developability and other properties necessary for the solder resist. Further, the cured photosensitive resin composition is halogen-free and flame-resistant, and is excellent in flexibility and particularly in folding endurance even after the IR reflow process. Therefore, the flexible circuit board can be produced as having a surface protective layer (cover insulating layer) excellent in folding endurance even after the IR reflow process by forming a solder resist film from the inventive photosensitive resin composition on the surface thereof formed with the electrically conductive circuit pattern. Further, the surface protective layer (cover insulating layer) of the solder resist film is free from the deposition of the cyclic phosphazene (flame retarder) in the higher-temperature higher-humidity environment, and excellent in flame resistance. In addition, the photosensitive resin composition is halogen-free as described above and, therefore, is useful from the viewpoint of the environmental protection. With excellent folding endurance, as described above, the solder resist film formed from the photosensitive resin composition can be provided instead of the cover lay film which is conventionally used as the surface protective layer formed in the foldable portion of the flexible circuit board. This solves the conventional problem that the combinational use of the cover lay film and the solder resist increases the number of the steps of the production process, thereby reducing the production costs. A mount board produced by mounting an electronic component on the flexible circuit board can be easily folded to be thereby properly accommodated in a narrow space. Therefore, the flexible circuit board is advantageously used as a mount board for a smaller size device such as a mobile phone.

Where the specific cyclic phosphazene (E) includes two or more types of cyclic phosphazenes, the deposition suppressing effect can be improved. This improves the flame resistance, while preventing the deposition which may otherwise occur when the proportion of the flame retarder is increased.

Where the linear polymer (A) has a carboxylic acid equivalent of 400 to 1300, the photosensitive resin composition is well balanced between the flexibility and the alkali developability.

Where the epoxy resin (B) has an epoxy equivalent of 450 to 2300 and is in a solid state at 25° C., the photosensitive resin composition is better balanced between the flexibility and the alkali developability.

Where the epoxy resin (B) is a bisphenol-A epoxy resin or a bisphenol-F epoxy resin, the photosensitive resin composition is well balanced between the flexibility and the heat resistance.

The properties of the inventive photosensitive resin composition make it possible to efficiently produce the flexible circuit board through a production method employing an exposure/development process, which includes the step of forming a cover insulating layer by forming a layer of the photosensitive resin composition on a conductive circuit pattern formation surface, and exposing and developing the photosensitive resin composition layer in a predetermined pattern to cure an exposed portion of the photosensitive resin composition layer.

BRIEF DESCRIPTION OF THE DRAWING

FIG. 1 is a graph showing a temperature profile of an IR reflow oven employed in Examples.

DETAILED DESCRIPTION OF THE INVENTION

An inventive photosensitive resin composition contains a linear polymer (A) of an ethylenically unsaturated compound including a carboxyl-containing ethylenically unsaturated compound, an epoxy resin (B), a polymerizable compound (C) containing an ethylenically unsaturated group, a photopolymerization initiator (D), and a specific cyclic phosphazene (E). The proportions of the respective components (A) to (E) are determined so that the photosensitive resin composition has a tensile breaking elongation percentage of not less than 10% and a 2% weight loss temperature of not lower than 260° C. after being cured.

In order to provide folding endurance required in the present invention (particularly, folding endurance after an IR reflow process), the cured photosensitive resin composition should have a tensile breaking elongation percentage of not less than 10% and a 2% weight loss temperature of not lower than 260° C. as described above. For more excellent folding endurance, the cured photosensitive resin composition preferably has a tensile breaking elongation percentage of not less than 20%. In order to provide excellent folding endurance even after the IR reflow process, the cured photosensitive resin composition preferably has a 2% weight loss temperature of not lower than 270° C.

In the present invention, the tensile breaking elongation percentage (EB) of the cured photosensitive resin composition is measured in conformity with JIS K6251. In the present invention, the 2% weight loss temperature of the cured photosensitive resin composition is defined as a heating temperature (° C.) at which a 2% weight loss is observed when the cured photosensitive resin composition is heated. At this time, a weight loss attributable to the weight of water absorbed by the cured photosensitive resin composition should be offset. If a weight loss of the cured photosensitive resin composition at 100° C. (the boiling point of water) is X %, for example, a heating temperature at which a (2+X) % weight loss is observed is defined as "2% weight loss temperature" because the water contained in the cured photosensitive resin composition is completely evaporated when the X % weight loss is observed.

The linear polymer (A) is prepared by employing a carboxyl-containing ethylenically unsaturated compound as a polymerizable material (monomer). This makes it possible to easily control the carboxylic acid equivalent of the linear polymer and to select the monomer for the linear polymer from various types of monomers. Therefore, the glass transition temperature (Tg) and other physical properties of the linear polymer can be easily designed. For example, (meth)acrylic acid or a styrene derivative containing a carboxyl group is used as the carboxyl-containing ethylenically unsaturated compound. In the present invention, (meth)acrylic acid means acrylic acid or methacrylic acid. The linear polymer (A) may be prepared by employing the carboxyl-containing ethylenically unsaturated compound alone as the polymerizable material, but is typically prepared by employing the carboxyl-containing ethylenically unsaturated compound in combination with other ethylenically unsaturated compound as the polymerizable material. Examples of the other ethylenically unsaturated compound include alkyl (meth)acrylates such as methyl (meth)acrylate, ethyl (meth)acrylate, butyl (meth)acrylate and 2-ethylhexyl (meth)acrylate, tetrahydrofurfuryl (meth)acrylate, dimethylaminoethyl (meth)acrylate, diethylaminoethyl (meth)acrylate, styrene, α-styrene, vinyltoluene, N-vinylpyrrolidone, 2-hydroxyethyl (meth)acrylate, acrylamide, acrylonitrile, methacrylonitrile, N-phenylmaleimide, cyclohexylmaleimide and phenoxyethyl acrylate, which may be used either alone or in combination. In the linear polymer (A), the carboxyl-containing ethylenically unsaturated compound is preferably present in a proportion of 7 to 80 wt % based on the overall weight of the linear polymer (A) for excellent alkali developability.

The linear polymer (A) is prepared, for example, by adding a catalyst (azobisisobutyronitrile or the like) and an organic solvent to the polymerizable material (monomer), and polymerizing the monomer with heating in a nitrogen atmosphere (at about 100° C. for about 5 hours).

The linear polymer (A) preferably has a carboxylic acid equivalent of 400 to 1300, more preferably 500 to 1200, further more preferably 600 to 1100. A carboxylic acid equivalent of less than 400 is not preferred because the cured photosensitive resin composition has a higher crosslink density and hence fails to have a higher breaking elongation percentage. On the other hand, if the carboxylic acid equivalent is greater than 1300, the alkali developability tends to be impaired.

The linear polymer (A) preferably has a weight average molecular weight of 5000 to 100000, more preferably 6000 to 90000, particularly preferably 7000 to 80000. If the weight average molecular weight is less than 5000, the physical properties such as the solder heat resistance tend to be impaired. If the weight average molecular weight is higher than 100000, the alkali developability tends to be impaired. The weight average molecular weight is determined, for example, by gel permeation chromatography (GPC) based on polystyrene calibration standards.

The epoxy resin (B) to be used in combination with the linear polymer (A) reacts with carboxyl groups of the linear polymer (A) to three-dimensionally crosslink the linear polymer (A), whereby the heat resistance and other physical properties of the cured photosensitive resin composition are improved. The epoxy resin (B) preferably has an epoxy equivalent of 450 to 2300 in order to impart the cured photosensitive resin composition with excellent flexibility and heat resistance. It is preferred that the epoxy resin (B) is in a solid state at 25° C., because the uncured photosensitive resin composition is less tacky and, hence, has excellent workability. If the epoxy equivalent of the epoxy resin is less than 450, the cured photosensitive resin composition is liable to have a lower tensile breaking elongation percentage. On the other hand, if the epoxy equivalent is greater than 2300, the alkali developability is liable to be impaired. The epoxy resin (B) is preferably a bisphenol-A epoxy resin or a bisphenol-F epoxy resin to impart the cured photosensitive resin composition with excellent flexibility and heat resistance.

Examples of the polymerizable compound (C) containing the ethylenically unsaturated group to be used in combination with the components (A) and (B) include 2-hydroxyethyl (meth)acrylate, trimethylolpropane tri(meth)acrylate, pentaerythritol tri(meth)acrylate, dipentaerythritol hexa(meth) acrylate, N,N-dimethyl (meth)acrylamide, N-methylol (meth)acrylamide, urethane (meth)acrylate, a product obtained through reaction of bisphenol-A and polyethylene glycol or polypropylene glycol, mono- or multi-functional (meth)acrylates such as of tris(2-hydroxyethyl)isocyanurate, (meth)acrylates of glycidyl ethers such as triglycidyl isocyanurate, and photopolymerizable monomers such as diallyl phthalate, which may be used either alone or in combination. Particularly, a bisphenol-A di(meth)acrylate compound represented by the following general formula (2) is preferred for excellent property balance among the solder heat resistance, the folding endurance, the alkali developability and other properties.

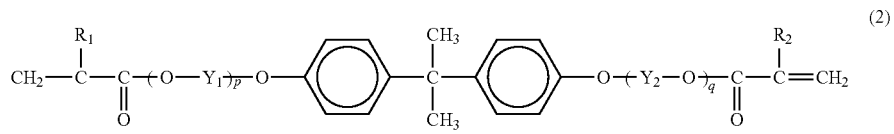

(2)

wherein $R_1$ and $R_2$, which may be the same or different, are each a hydrogen atom or a methyl group; $Y_1$ and $Y_2$ are each a $C_2$ to $C_6$ alkylene group; p and q are positive integers which satisfy a relationship of p+q=4 to 40; and benzene rings may each have a substituent.

Examples of the $C_2$ to $C_6$ alkylene group in the formula (2) include an ethylene group, a propylene group, an isopropylene group, a butylene group, an isobutylene group, a pentylene group, a neopentylene group and a hexylene group, among which the ethylene group is particularly preferred.

The isopropylene group is represented by —CH(CH$_3$)CH$_2$—. Two possible bonding orientations of the isopropylene group in the —(O—$Y_1$)— group and the —($Y_2$—O)— group in the above general formula (2) are such that the methylene group is bonded to oxygen and such that the methylene group is not bonded to oxygen. In the formula (2), these two bonding orientations may be present either alone or in combination.

Where two or more —(O—$Y_1$)— repeating units and two or more —($Y_2$—O)— repeating units are present in the formula (2), two or more $Y_1$ groups and two or more $Y_2$ groups may be the same or different from each other. Where two or more types of alkylene groups are present as $Y_1$ and $Y_2$, two or more types of —(O—$Y_1$)— repeating units and two or more types of —($Y_2$—O)— repeating units may be present at random or in a block form.

In the general formula (2), the two benzene rings may each have a substituent or have no substituent. More specifically, the benzene rings may each have one or more substituents at substitutable sites thereof. Where the benzene rings each have two or more substituents, the substituents may be the same or different from each other. Examples of the substituents include halogen atoms, $C_1$ to $C_{20}$ alkyl groups, $C_3$ to $C_{10}$ cycloalkyl groups, $C_6$ to $C_{14}$ aryl groups, an amino group, a nitro group, a cyano group, a mercapto group, an allyl group, $C_1$ to $C_{10}$ alkylmercapto groups, $C_1$ to $C_{20}$ hydroxyalkyl groups, carboxyalkyl groups having $C_1$ to $C_{10}$ alkyl groups, acyl groups having $C_1$ to $C_{10}$ alkyl groups, $C_1$ to $C_{20}$ alkoxy groups, and heterocyclic groups.

In the general formula (2), the repeating numbers p, q are positive integers, which satisfy a relationship of p+q=4 to 40, more preferably p+q=4 to 15, particularly preferably p+q=5 to 13. If p+q<4, a film formed from the resulting photosensitive resin composition tends to have greater warpage and poorer folding endurance. If p+q>40, the resulting photosensitive resin composition totally tends to be more hydrophilic, and a film formed from the photosensitive resin composition tends to have poorer insulation reliability under high temperature and high humidity conditions.

Examples of the bisphenol-A di(meth)acrylate compound represented by the general formula (2) include 2,2'-bis[4-(meth)acryloxydiethoxyphenyl]propane, 2,2'-bis[4-(meth)acryloxytetraethoxyphenyl]propane, 2,2'-bis[4-(meth)acryloxypentaethoxyphenyl]propane, 2,2'-bis[4-(meth)acryloxydiethoxyoctapropoxyphenyl]propane, and 2,2'-bis[4-(meth)acryloxytriethoxyoctapropoxyphenyl]propane, which may be used either alone or in combination.

Examples of the photopolymerization initiator (D) to be used in combination with the components (A) to (C) include substituted or unsubstituted polynuclear quinones (2-ethylanthraquinone, 2-t-butylanthraquinone, octamethylanthraquinone, 1,2-benzanthraquinone, 2,3-diphenylanthraquinone and the like), α-ketaldonyl alcohols (benzoin, pivalone and the like), ethers, α-hydrocarbon-substituted aromatic acyloins (α-phenylbenzoin, α,α-diethoxyacetophenone and the like), aromatic ketones (benzophenone and 4,4'-bisdialkylaminobenzophenones such as N,N'-tetraethyl-4,4'-diaminobenzophenone, and the like), thioxanthones (2-methylthioxanthone, 2,4-diethylthioxanthone, 2-chlorothioxanthone, 2-isopropylthioxanthone, 2-ethylthioxanthone and the like), and 2-methyl-1-[4-(methylthio)phenyl]-morpholinopropan-1-one, which may be used either alone or in combination.

The cyclic phosphazene (E) to be used in combination with the components (A) to (D) is represented by the following general formula (1):

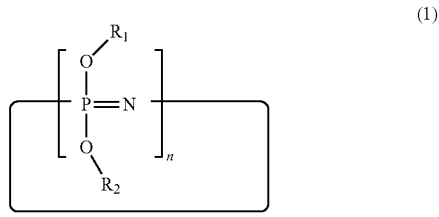

wherein $R_1$ and $R_2$, which may be the same or different, are each a $C_1$ to $C_{18}$ alkyl group,

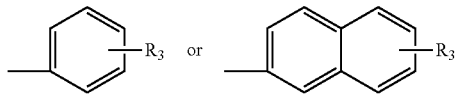

(wherein $R_3$ is a hydrogen atom, a cyano group, a $C_1$ to $C_{10}$ alkyl group, an allyl group, a phenyl group or a hydroxyl group), and n is an integer of 3 to 25.

Particularly, it is preferred to use two or more types of cyclic phosphazenes (E) each represented by the general formula (1) in combination for improvement of the deposition suppressing effect. This further improves the flame resistance, while preventing the deposition of the cyclic phosphazene (flame retarder) which may otherwise occur when the proportion of the cyclic phosphazene is increased. Particularly, it is preferred to use two or more types of cyclic phenoxyphosphazenes having different chemical structures in order to pass a stricter flame resistance test (to achieve the UL-94 VTM-0 flame resistance rating). More specifically, a cyclic phenoxyphosphazene represented by the above general formula (1) wherein $R_1$, $R_2$ are each a phenyl group and n=3 to 4 and a cyclic phenoxyphosphazene represented by the above general formula (1) wherein $R_1$ is a cyanophenyl group, $R_2$ is a phenyl group and n=3 to 4 may be used in combination. These phenoxyphosphazenes are available under the trade names of FP100 and FP300 from Fushimi Pharmaceutical Co., Ltd.

The proportion of the cyclic phosphazene (E) is properly determined depending on the standardized level of flame resistance required to be satisfied by the photosensitive resin composition. To pass the UL-94 HB test, the proportion of the cyclic phosphazene is set to 10 to 30 wt % based on the overall weight of the resin composition. To achieve the UL-94 VTM-0 flame resistance rating, the proportion of the cyclic phosphazene is set to 20 to 40 wt % based on the overall weight of the resin composition.

As described above, the proportions of the components (A) to (E) of the inventive photosensitive resin composition are determined so that the cured photosensitive resin composition has a tensile breaking elongation percentage of not less than 10% and a 2% weight loss temperature of not lower than 260° C. In the present invention, therefore, it is necessary to determine the proportions of the respective components from this viewpoint. The proportion of the component (A) is preferably 20 to 70 wt %, more preferably 30 to 60 wt %, based on the overall weight of the photosensitive resin composition, and the proportion of the component (B) is preferably 3 to 40 wt %, more preferably 5 to 30 wt %, based on the overall weight of the photosensitive resin composition. Further, the proportion of the component (C) is preferably 3 to 40 wt %, more preferably 5 to 30 wt %, based on the overall weight of the photosensitive resin composition, and the proportion of the component (D) is preferably 0.1 to 10 wt %, more preferably 0.2 to 8 wt %, based on the overall weight of the photosensitive resin composition.

As required, pigments such as phthalocyanine green, phthalocyanine blue and titanium oxide, fillers such as silica, barium sulfate and talc, defoaming agents, leveling agents, flame retarders, stabilizing agents, tackifiers such as 2-amino-5-mercapto-1,3,4-thiodiazole and 5-amino-1-H-tetrazole, antirust agents such as benzotriazole, and other additives may be blended with the aforementioned components of the inventive photosensitive resin composition. These additives may be used either alone or in combination. The total amount of any of these additives present in the photosensitive resin composition is preferably in the range of 0.01 to 30 wt % based on the overall weight of the photosensitive resin composition.

The inventive photosensitive resin composition is prepared by blending and mixing the aforementioned components in the aforementioned proportions. As required, the photosensitive resin composition may be mixed with an organic solvent for use. Examples of the organic solvent include diethylene glycol monoethyl ether acetate, diethylene glycol monobutyl ether acetate, diethylene glycol monoethyl ether, diethylene glycol monomethyl ether, propylene glycol monomethyl ether acetate, solvent naphtha, N-methylpyrrolidone, γ-butyrolactone, butyl Cellosolve, ethyl Cellosolve, methyl Cellosolve, toluene, xylene, mesitylene, acetone, methyl ethyl ketone, methyl isobutyl ketone, and solvent mixtures of any of these organic solvents.

The amount of the organic solvent to be mixed with the photosensitive resin composition is preferably about 0 to 200 parts by weight per 100 parts by weight of the photosensitive resin composition.

The inventive photosensitive resin composition is useful as a solder resist material, for example, for a wiring circuit board such as a flexible printed wiring board. Further, the inventive photosensitive resin composition may be used for a paint, a coating material and an adhesive.

Where the inventive photosensitive resin composition is used as a solder resist material for the wiring circuit board, for example, a solder resist film is formed in the following manner. An exemplary process for forming the solder resist film on a flexible printed wiring board will hereinafter be described.

A photosensitive resin composition film having a dry thickness of 5 to 50 μm is first formed on a surface of the flexible printed wiring board formed with an electrically conductive circuit pattern by applying the inventive photosensitive resin composition on the surface by a screen printing method, a spray method, a roll coating method or an electrostatic coating method and drying the applied photosensitive resin composition at 50 to 160° C. for about 1 to about 60 minutes. Then, a negative or positive mask pattern film is brought into direct contact or noncontact with the photosensitive resin composition film, which is in turn irradiated with activation radiation via the mask pattern film. Thus, a resin film is formed.

Alternatively, a photosensitive resin composition film having a dry thickness of 5 to 50 μm is formed on a transparent base film such as of a polyethylene terephthalate (PET) or a polypropylene (PP) by applying the inventive photosensitive resin composition on the transparent base film and drying the applied photosensitive resin composition. Then, a protective film such as of a polyethylene or a polymethylpentene is stacked on the photosensitive resin composition film, whereby a laminate including the inventive photosensitive resin composition (film) is prepared. After the protective film is removed from the laminate, the remaining photosensitive resin composition film is bonded onto a surface of the flexible printed wiring board formed with an electrically conductive circuit pattern. Then, a mask pattern film is brought into direct contact or noncontact with the transparent base film, and the photosensitive resin composition film is irradiated with activation radiation via the mask pattern film. Thereafter, the transparent base film is removed.

Examples of a light source for the activation radiation include a carbon arc lamp, a mercury vapor arc lamp, an ultra high pressure mercury lamp, a high pressure mercury lamp and a xenon lamp which are capable of effectively emitting ultraviolet radiation, and a photoflood lamp and a solar lamp which are capable of effectively emitting visible light.

Subsequently, the photosensitive resin film resulting from the irradiation with the activation radiation is developed for removal of an unexposed portion of the photosensitive resin composition film with the use of a developing agent such as an alkali aqueous solution by a spray method, an oscillatory immersion method, a brushing method or a scraping method. Thus, a resist pattern is formed.

Examples of the alkali aqueous solution to be used for the development include a 0.1 to 5 wt % dilute solution of sodium carbonate, a 0.1 to 5 wt % dilute solution of potassium carbonate, a 0.1 to 5 wt % dilute solution of sodium hydroxide and a 0.1 to 5 wt % dilute solution of sodium tetraborate.

After the development, the resulting resist pattern is crosslinked by heating for improvement of solder heat resistance and chemical resistance. A temperature of about 100° C. to about 260° C. and a heating period of about 1 to about 120 minutes are preferably employed for the heating. As required, the resist pattern is irradiated with ultraviolet radiation emitted from the high pressure mercury lamp or the low pressure mercury lamp before or after the heating. The dose of the ultraviolet radiation is preferably about 0.2 to about 10 J/cm².

Thus, the flexible printed wiring board is produced as having the solder resist film. Thereafter, electronic components such as an LSI, a diode, a transistor and a capacitor are mounted on the flexible printed wiring board by soldering. Then, the resulting mount board is mounted in a smaller size device such as a mobile phone.

Next, inventive examples will be described in conjunction with comparative examples. It should be understood that the present invention be not limited to the inventive examples.

EXAMPLES

Synthesis of Polymer (Carboxyl-Containing Linear Polymer) A1

First, 29 g of methyl methacrylate, 21 g of methacrylic acid, 50 g of phenoxyethyl acrylate, 81.8 g of propylene glycol monomethyl ether acetate (solvent) and 1.0 g of azobisisobutyronitrile (catalyst) were put in a 300-mL separable flask in a nitrogen atmosphere, and allowed to react at 100° C. for 5 hours with heating and stirring. Thus, a carboxyl-containing linear polymer solution (having a solid concentration of 55 wt %) was prepared. The solid (polymer A1) in the solution had a carboxylic acid equivalent (calculated value) of 410 and a weight average molecular weight (Mw) of 15000.

Synthesis of Polymers (Carboxyl-Containing Linear Polymers) A2 to A5

Carboxyl-containing linear polymer solutions (each having a solid concentration of 55 wt %) were prepared by substantially the same method as the synthesis method of the polymer A1, except that the proportions of the respective components were changed as shown in Table 1. The carboxylic acid equivalents and the weight average molecular weights of the solids (polymers A2 to A5) in the resulting solutions are also shown in Table 1.

TABLE 1

| | (g) Polymer | | | | |
|---|---|---|---|---|---|
| | A1 | A2 | A3 | A4 | A5 |
| Monomer | | | | | |
| Methyl methacrylate | 29 | 40 | 43.3 | 25 | 93.5 |
| Methacrylic acid | 21 | 10 | 6.7 | 25 | 6.5 |
| Butyl acrylate | — | 50 | 50 | — | — |
| Phenoxyethyl acrylate | 50 | — | — | 50 | — |
| Solvent | | | | | |
| Propylene glycol monomethyl ether acetate | 81.8 | 81.8 | 81.8 | 81.8 | 81.8 |
| Catalyst | | | | | |
| Azobisisobutyronitrile | 1.0 | 1.0 | 1.0 | 1.0 | 1.0 |
| Carboxylic acid equivalent (calculated value) | 410 | 860 | 1284 | 344 | 1323 |
| Weight average molecular weight (Mw) | 15000 | 14000 | 12000 | 20000 | 15000 |

Next, the following ingredients were prepared.
Epoxy Resin B1
A bisphenol-A epoxy resin (having an epoxy equivalent of 480) (JER1001 available from Japan Epoxy Resins Co., Ltd.)
Epoxy Resin B2
A bisphenol-F epoxy resin (having an epoxy equivalent of 850) (JER1055 available from Japan Epoxy Resins Co., Ltd.)
Epoxy Resin B3
A bisphenol-F epoxy resin (having an epoxy equivalent of 2280) (JER4007P available from Japan Epoxy Resins Co., Ltd.)
Epoxy Resin B4
A bisphenol-A epoxy resin (having an epoxy equivalent of 2850) (JER1009 available from Japan Epoxy resins Co., Ltd.)
Epoxy Resin B5
A modified epoxy resin (having an epoxy equivalent of 480) (FX-305 available from Tohto Kasei Co., Ltd.)
Ethylenically Unsaturated Group-Containing Polymerizable Compound C1
A bisphenol-A methacrylate modified with ethylene oxide (BPE500 available from Shin-Nakamura Chemical Co., Ltd. and represented by the above formula (2) in which p+q=10)
Ethylenically Unsaturated Group-Containing Polymerizable Compound C2
Trimethylolpropane triacrylate (A-TMPT available from Shin-Nakamura Chemical Co., Ltd.)
Photopolymerization Initiator
IRGACURE 369 available from Ciba Geigy Corporation
Flame Retarder E1
A cyclic phenoxyphosphazene (FP100 available from Fushimi Pharmaceutical Co., Ltd. and represented by the above formula (1) in which $R_1$ and $R_2$ are each a phenyl group and n=3 to 4)

Flame Retarder E2
A cyclic phenoxyphosphazene (FP300 available from Fushimi Pharmaceutical Co., Ltd. and represented by the above formula (1) in which $R_1$ is a cyanophenyl group, $R_2$ is a phenyl group and n=3 to 4)
Flame Retarder E3
An aromatic phosphate (CR741 available from Daihachi Chemical Industry Co., Ltd.)
Pigment
Phthalocyanine blue Examples 1 to 7 and Comparative Examples 1 and 2

Photosensitive resin compositions were prepared by blending ingredients in proportions (parts by weight) shown in Table 2 (the proportions of the polymers A1 to A5 are expressed in the unit of solid parts by weight in Table 2).

The tensile breaking elongation percentage and the 2% weight loss temperature of each of cured photosensitive resin compositions were measured in the following manner. The results are shown in Table 2.
Tensile Breaking Elongation Percentage The photosensitive resin compositions (solutions) thus prepared were each applied onto one surface of a 50-μm thick polypropylene film and dried (at 80° C. for 30 minutes) to form a photosensitive resin composition film having a dry thickness of 25 μm, and a 30-μm thick polyethylene cover film was brought into intimate contact with the photosensitive resin composition film. Then, the photosensitive resin composition film was irradiated with ultraviolet radiation emitted from a 250 W ultra high pressure mercury lamp at a dose of 500 mJ/cm$^2$ through the polyethylene cover film. Thereafter, the cover film was removed, and the irradiated film was developed by applying a 1 wt % sodium carbonate aqueous solution at 30° C. at a pressure of 0.2 MPa for 90 seconds. Further, the developed film was rinsed with tap water for 60 seconds, and then heat-treated at 150° C. for 8 hours in a hot air circulation drier. A resin film obtained by thus curing the photosensitive resin composition was removed from the polypropylene film, and a test sample having a width of 5 mm and a length of 50 mm was cut out of the resin film. In conformity with JIS K6251, the test sample was set in a tensile tester (TECHNOGRAPH TG-1kN available from Minebea Co., Ltd.) with an inter-chuck distance of 20 mm, and stretched at a rate of 5 mm/min. An elongation percentage (%) observed when the test sample was broken was defined as the tensile breaking elongation percentage.

2% Weight Loss Temperature

The photosensitive resin compositions (solutions) prepared in the aforementioned manner were each applied onto one surface of a 50-μm thick polypropylene film and dried (at 80° C. for 30 minutes) to form a photosensitive resin composition film having a dry thickness of 25 μm, and a 30-μm thick polyethylene cover film was brought into intimate contact with the photosensitive resin composition film. Then, the photosensitive resin composition film was irradiated with ultraviolet radiation emitted from a 250 W ultra high pressure mercury lamp at a dose of 500 mJ/cm² through the polypropylene cover film. Thereafter, the cover film was removed, and the irradiated film was developed by applying a 1 wt % sodium carbonate aqueous solution at 30° C. at a pressure of 0.2 MPa for 90 seconds. Further, the developed film was rinsed with tap water for 60 seconds, and then heat-treated at 150° C. for 8 hours in a hot air circulation drier. A resin film obtained by thus curing the photosensitive resin composition was removed from the polypropylene film, and a test sample having a weight of about 10 mg was cut out of the resin film. The test sample was set in a differential thermobalance (TG8120 available from Rigaku Corporation), and a change in the weight of the test sample was measured in a nitrogen stream while an ambient temperature was increased from a room temperature to 350° C. at a rate of 10° C./min. In order to offset a weight loss attributable to water absorbed by the test sample, a temperature at which a (2+X) % weight loss (wherein X % is a weight loss percentage at 100° C.) was observed was defined as the 2% weight loss temperature.

ylene cover film was brought into intimate contact with the photosensitive resin composition film. Then, the photosensitive resin composition film was irradiated with ultraviolet radiation emitted from a 250 W ultra high pressure mercury lamp at a dose of 500 mJ/cm² through the polyethylene cover film. Thereafter, the cover film was removed, and the irradiated film was developed by applying a 1 wt % sodium carbonate aqueous solution at 30° C. at a pressure of 0.2 MPa for 90 seconds. Further, the developed film was rinsed with tap water for 60 seconds, and then heat-treated at 150° C. for 8 hours in a hot air circulation drier. Thus, a laminate including a resin film formed from the photosensitive resin composition on the polyimide film was produced. Subsequently, the laminate was passed through an IR reflow oven having a temperature profile shown in FIG. 1 three times, and a test sample having a width of 10 mm and a length of 70 mm was cut out of the laminate. The test sample was bent 180 degrees with its resin film facing outward, and loaded with a weight of 1 kg with a diameter of 30 mm for 10 seconds and unloaded. Then, the bent portion of the test sample was observed at a magnification of about 40× by means of an optical microscope, and checked for the cracking of the resin film. Where the test sample had no crack, the test sample was restored to its unbent state, and loaded with a weight of 1 kg with a diameter of 30 mm for 10 seconds. Further, the test sample was bent again 180 degrees with its resin film facing outward, and loaded with a weight of 1 kg with a diameter of 30 mm for 10 seconds and unloaded. Then, the bent portion of the test sample was observed at a magnification of about 40× by means of the

TABLE 2

| | | (parts by weight) | | | | | | | | |
|---|---|---|---|---|---|---|---|---|---|---|
| | | Example | | | | | | | Comparative Example | |
| | | 1 | 2 | 3 | 4 | 5 | 6 | 7 | 1 | 2 |
| Polymer | A1 | 44 | — | — | — | — | — | — | — | — |
| | A2 | — | 44 | 50 | — | 44 | 44 | 44 | — | — |
| | A3 | — | — | — | 50 | — | — | — | — | — |
| | A4 | — | — | — | — | — | — | — | 44 | — |
| | A5 | — | — | — | — | — | — | — | — | 44 |
| Epoxy resin | B1 | 18.8 | — | — | — | — | — | — | — | — |
| | B2 | — | 18.8 | — | 12.8 | 18.8 | 18.8 | 18.8 | — | — |
| | B3 | — | — | 12.8 | — | — | — | — | — | — |
| | B4 | — | — | — | — | — | — | — | — | 18.8 |
| | B5 | — | — | — | — | — | — | — | 18.8 | — |
| Ethylenically unsaturated group— | C1 | 15 | 15 | 15 | 15 | 15 | 15 | 15 | 10 | 15 |
| Containing polymerizable compound | C2 | — | — | — | — | — | — | — | 5 | — |
| Photopolymerization initiator | | 2 | 2 | 2 | 2 | 2 | 2 | 2 | 2 | 2 |
| Flame retarder | E1 | — | 20 | — | 20 | 40 | — | 20 | — | 20 |
| | E2 | 20 | — | 20 | — | — | 40 | 20 | — | — |
| | E3 | — | — | — | — | — | — | — | 20 | — |
| Pigment | | 0.2 | 0.2 | 0.2 | 0.2 | 0.2 | 0.2 | 0.2 | 0.2 | 0.2 |
| Tensile breaking elongation percentage (%) | | 10 | 42 | 50 | 60 | 68 | 20 | 55 | 11 | 6 |
| 2% weight loss temperature (° C.) | | 260 | 298 | 295 | 302 | 295 | 293 | 296 | 255 | 280 |

Further, the photosensitive resin compositions (solutions) of Examples 1 to 7 and Comparative Examples 1 and 2 each having a tensile breaking elongation percentage and a 2% weight loss temperature measured in the aforementioned manner were evaluated for the following properties in the following manner. The results of the evaluation are shown in Table 3.

Folding Endurance Number

The photosensitive resin composition solutions prepared in the aforementioned manner were each applied onto one surface of a 25-μm thick polyimide film and dried (at 80° C. for 30 minutes) to form a photosensitive resin composition film having a dry thickness of 25 μm, and a 30-μm thick polyethoptical microscope, and checked for the cracking of the resin film. The procedure described above was repeated until the resin film was cracked. A folding endurance number was determined by subtracting one from the number of times of bending before the cracking of the resin film. Where the resin film had no crack even after 10 times of bending, the folding endurance number is expressed as "10<" in Table 2. In the present invention, the folding endurance number is required to be at least one or more.

Alkali Developability

A double layer substrate including an 18-μm thick copper foil directly provided on a polyimide film was prepared for a flexible printed wiring board, and a surface of the copper foil was degreased and soft-etched to be properly conditioned. Thereafter, the photosensitive resin composition solutions prepared in the aforementioned manner were each applied onto the copper foil of the substrate and dried (at 80° C. for 30 minutes) to form a photosensitive resin composition film having a dry thickness of 25 μm, and a 30-μm thick polyethylene film was brought into intimate contact with the photosensitive resin composition film. Then, the photosensitive resin composition film was irradiated with ultraviolet radiation emitted from a high pressure mercury lamp at a dose of 500 mJ/cm$^2$ through a glass mask formed with a 5 mm square negative pattern. Thereafter, the polyethylene film was removed, and the irradiated film was developed by applying a 1 wt % sodium carbonate aqueous solution at 30° C. at a pressure of 0.2 MPa for 90 seconds. Further, the developed film was rinsed with tap water for 60 seconds. Subsequently, an unexposed portion of the developed film was visually observed. A photosensitive resin composition leaving a residue after the development was rated as unacceptable (×), and a photosensitive resin composition leaving no residue after the development was rated as acceptable (○).

Flame Resistance HB

The photosensitive resin composition solutions prepared in the aforementioned manner were each applied onto one surface (front surface) of a 20-μm thick polyimide film and dried (at 80° C. for 30 minutes) to form a photosensitive resin composition film having a dry thickness of 25 μm, and a 30-μm thick polyethylene film was brought into intimate contact with the photosensitive resin composition film. Then, the photosensitive resin composition film was irradiated with ultraviolet radiation emitted from a 250 W ultra high pressure mercury lamp at a dose of 500 mJ/cm$^2$. Thereafter, the polyethylene film was removed, and the irradiated film was developed by applying a 1 wt % sodium carbonate aqueous solution at 30° C. at a pressure of 0.2 MPa for 90 seconds. Further, the developed film was rinsed with tap water for 60 seconds, and then heat-treated at 150° C. for 1 hour in a hot air circulation drier. In the same manner as described above, the photosensitive resin composition solutions prepared in the aforementioned manner were each applied onto a rear surface of the polyimide film and dried (at 80° C. for 30 minutes) to form a second photosensitive resin composition film having a dry thickness of 25 μm, and a 30-μm thick polyethylene film was brought into intimate contact with the second photosensitive resin composition film. Then, the second photosensitive resin composition film was irradiated with ultraviolet radiation emitted from the 250 W ultra high pressure mercury lamp at a dose of 500 mJ/cm$^2$. Thereafter, the polyethylene film was removed, and the irradiated film was developed by applying a 1 wt % sodium carbonate aqueous solution at 30° C. at a pressure of 0.2 MPa for 90 seconds. Further, the developed film was rinsed with tap water for 60 seconds, and then heat-treated at 150° C. for 8 hours in the hot air circulation drier. A test sample of the resulting resin film was evaluated for flame resistance with the use of an apparatus (a UL combustion test chamber available from Toyo Seiki Seisakusho, Ltd.) and a method (HB method) in conformity with the Standard UL94 for a flammability test. A test sample that passed the UL-94 HB test was rated as acceptable (○), and a test sample that failed to pass the UL-94 HB test was rated as unacceptable (×).

As apparent from the above results, the resin films formed from the photosensitive resin compositions of the inventive examples were excellent in folding endurance and alkali developability, and achieved the predetermined flame resistance rating though they were halogen-free. With the use of the photosensitive resin compositions of the inventive examples, it was possible to provide flexible circuit boards each having an excellent surface protective layer.

On the other hand, the resin film formed from the photosensitive resin composition of Comparative Example 1 had a 2% weight loss temperature lower than the specified level, and was poorer in folding endurance. The resin film formed from the photosensitive resin composition of Comparative Example 2 had a tensile breaking elongation percentage much lower than the specified level, and was poorer in folding endurance and alkali developability.

The photosensitive resin compositions of the inventive examples and the comparative examples were evaluated for flame resistance based on the VTM method stricter than the HB method and for flame retarder deposition suppressing effect in the following manner. The results are shown in Table 4.

Flame Resistance VTM

The VTM method was employed instead of the HB method described above to perform the flame resistance test. A test sample that achieved the UL-94 VTM-0 rating was rated as acceptable (○), and a test sample that failed to achieve the UL-94 VTM-0 rating was rated as unacceptable (×).

Deposition of Flame Retarder

The photosensitive resin composition solutions of the inventive examples and the comparative examples were each applied onto one surface of a 25-μm thick polyimide film and dried (at 80° C. for 30 minutes) to form a photosensitive resin composition film having a dry thickness of 25 μm, and a 30-μm thick polyethylene cover film was brought into intimate contact with the photosensitive resin composition film. Then, the photosensitive resin composition film was irradiated with ultraviolet radiation emitted from a 250 W ultra high pressure mercury lamp at a dose of 500 mJ/cm$^2$ through the polyethylene cover film. Thereafter, the cover film was removed, and the irradiated film was developed by applying a 1 wt % sodium carbonate aqueous solution at 30° C. at a pressure of 0.2 MPa for 90 seconds. Further, the developed film was rinsed with tap water for 60 seconds, and then heat-treated at 150° C. for 8 hours in a hot air circulation drier. Thus, a laminate including a resin film formed from the photosensitive resin composition on the polyimide film was produced. Subsequently, the laminate was passed through an IR reflow oven having a temperature profile shown in FIG. 1 three times. After the resulting laminate (test sample) was maintained in a constant temperature/constant humidity chamber at 80° C. at 95% RH for 250 hours, a surface of the resin film was observed at a magnification of about 50× by means of a microscope, and checked for deposit. A test sample that suffered from deposition was rated as unacceptable (×), and a test sample that was free from deposition was rated as acceptable (○). The deposit was analyzed by means of an FTIR (μ-FT-IR NICOLET4700+Continuum available

TABLE 3

|  | Example | | | | | | | Comparative Example | |
| --- | --- | --- | --- | --- | --- | --- | --- | --- | --- |
|  | 1 | 2 | 3 | 4 | 5 | 6 | 7 | 1 | 2 |
| Folding endurance number | 1 | 6 | 10< | 10< | 10< | 2 | 10< | 0 | 0 |
| Alkali developability | ○ | ○ | ○ | ○ | ○ | ○ | ○ | ○ | x |
| Flame resistance HB | ○ | ○ | ○ | ○ | ○ | ○ | ○ | ○ | ○ | from Thermo Electron Corporation), and the major portion of the deposit was identified as a flame retarder (phosphazene compound).

TABLE 4

|  | Example | | | | | | | Comparative Example | |
|---|---|---|---|---|---|---|---|---|---|
|  | 1 | 2 | 3 | 4 | 5 | 6 | 7 | 1 | 2 |
| Flame resistance VTM | x | x | x | x | ○ | ○ | ○ | x | x |
| Deposition of flame retarder | ○ | ○ | ○ | ○ | x | x | ○ | x | x |

As apparent from the above results, the resin films formed from the photosensitive resin compositions of Examples 5 to 7 each containing the flame retarder(s) in a greater amount than those of Examples 1 to 4 and Comparative Examples 1 and 2 achieved the VTM-0 flame resistance rating. However, the resin films of Examples 5 and 6 suffered from deposition of the flame retarder in the higher-temperature higher-humidity environment because of the addition of a greater amount of the flame retarder. In contrast, the resin film formed from the photosensitive resin composition of Example 7 containing the flame retarder E1and the flame retarder E2 in combination in a greater total amount was substantially free from the deposition of the flame retarders. The resin films of Examples 1 to 4 were also free from the deposition of the flame retarder in the higher-temperature higher-humidity environment. The resin films of Comparative Examples 1 and 2 each containing the flame retarder in the same amount as those of Examples 1 to 4 suffered from the deposition of the flame retarder.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A photosensitive resin composition comprising:
   (A) a linear polymer of an ethylenically unsaturated compound comprising a carboxyl-containing ethylenically unsaturated compound;
   (B) a bisphenol-F epoxy resin;
   (C) a polymerizable compound containing an ethylenically unsaturated group;
   (D) a photopolymerization initiator; and
   (E) a cyclic phosphazene represented by the following general formula (1):

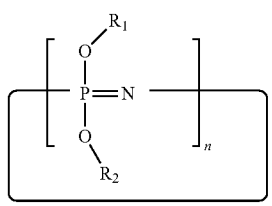

(1)

wherein $R_1$ and $R_2$, which may be the same or different, are each a $C_1$ to $C_{18}$ alkyl group,

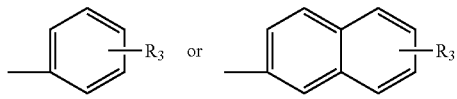

(wherein $R_3$ is a hydrogen atom, a cyano group, a $C_1$ to $C_{10}$ alkyl group, an allyl group, a phenyl group or a hydroxyl group), and n is an integer of 3 to 25,
the photosensitive resin composition having a tensile breaking elongation percentage of not less than 10% and a 2% weight loss temperature of not lower than 260° C. after being cured.

2. A photosensitive resin composition as set forth in claim 1, wherein the cyclic phosphazene (E) includes at least two types of cyclic phosphazenes each represented by the general formula (1).

3. A photosensitive resin composition as set forth in claim 1, wherein the linear polymer (A) has a carboxylic acid equivalent of 400 to 1300.

4. A photosensitive resin composition as set forth in claim 2, wherein the linear polymer (A) has a carboxylic acid equivalent of 400 to 1300.

5. A photosensitive resin composition as set forth in claim 1, wherein the epoxy resin (B) has an epoxy equivalent of 450 to 2300 and is in a solid state at 25° C.

6. A photosensitive resin composition as set forth in claim 2, wherein the epoxy resin (B) has an epoxy equivalent of 450 to 2300 and is in a solid state at 25° C.

7. A photosensitive resin composition as set forth in claim 3, wherein the epoxy resin (B) has an epoxy equivalent of 450 to 2300 and is in a solid state at 25° C.

8. A photosensitive resin composition as set forth in claim 4, wherein the epoxy resin (B) has an epoxy equivalent of 450 to 2300 and is in a solid state at 25° C.

9. A flexible circuit board comprising:
   a wiring circuit board having a surface formed with an electrically conductive pattern; and
   a cover insulating layer provided on the surface of the wiring circuit board;
   the cover insulating layer being a layer formed from a photosensitive resin composition as recited in claim 1.

10. A flexible circuit board production method for producing a flexible circuit board comprising:
    a wiring circuit board having a surface formed with an electrically conductive pattern; and
    a cover insulating layer provided on the surface of the wiring circuit board;
    the cover insulating layer being a layer formed from a photosensitive resin composition as recited in claim 1,
    the method comprising the steps of:
    preparing a wiring circuit board having a surface formed with an electrically conductive circuit pattern; and
    forming a cover insulating layer by forming a layer of a photosensitive resin composition as recited in claim 1 on the surface of the wiring circuit board, exposing the photosensitive resin composition layer in a predetermined pattern, and developing the exposed photosensitive resin composition layer.

11. A photosensitive resin composition as set forth in claim 1, wherein a content ratio of the cyclic phosphazene as the component (E) falls within a range of 20 to 40% by weight of a total amount of the resin composition.

12. A photosensitive resin composition as set forth in claim 2, wherein a content ratio of the cyclic phosphazene as the component (E) falls within a range of 20 to 40% by weight of a total amount of the resin composition.

13. A photosensitive resin composition as set forth in claim 3, wherein a content ratio of the cyclic phosphazene as the component (E) falls within a range of 20 to 40% by weight of a total amount of the resin composition.

14. A photosensitive resin composition as set forth in claim 4, wherein a content ratio of the cyclic phosphazene as the component (E) falls within a range of 20 to 40% by weight of a total amount of the resin composition.

15. A photosensitive resin composition as set forth in claim 5, wherein a content ratio of the cyclic phosphazene as the component (E) falls within a range of 20 to 40% by weight of a total amount of the resin composition.

16. A photosensitive resin composition as set forth in claim 6, wherein a content ratio of the cyclic phosphazene as the component (E) falls within a range of 20 to 40% by weight of a total amount of the resin composition.

17. A photosensitive resin composition as set forth in claim 7, wherein a content ratio of the cyclic phosphazene as the component (E) falls within a range of 20 to 40% by weight of a total amount of the resin composition.

18. A photosensitive resin composition as set forth in claim 8, wherein a content ratio of the cyclic phosphazene as the component (E) falls within a range of 20 to 40% by weight of a total amount of the resin composition.

* * * * *